US009864549B2

(12) United States Patent
Yang et al.

(10) Patent No.: US 9,864,549 B2
(45) Date of Patent: Jan. 9, 2018

(54) SYSTEMS AND METHODS FOR HIGH THROUGHPUT MULTI-INPUT COMPRESSION

(71) Applicant: Avago Technologies General IP (Singapore) Pte. Ltd., Singapore (SG)

(72) Inventors: Shaohua Yang, San Jose, CA (US); Han Fang, Shanghai (CN); Wu Chang, Santa Clara, CA (US); Kelly Fitzpatrick, Sudbury, MA (US)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 129 days.

(21) Appl. No.: 15/057,081

(22) Filed: Feb. 29, 2016

(65) Prior Publication Data
US 2017/0249105 A1 Aug. 31, 2017

(51) Int. Cl.
*G06F 12/00* (2006.01)
*G06F 3/06* (2006.01)
(52) U.S. Cl.
CPC .......... *G06F 3/0661* (2013.01); *G06F 3/0608* (2013.01); *G06F 3/0683* (2013.01)

(58) Field of Classification Search
None
See application file for complete search history.

(56) References Cited

U.S. PATENT DOCUMENTS

| 5,771,011 | A | 6/1998 | Masenas |
| 5,903,230 | A | 5/1999 | Masenas |
| 6,208,273 | B1 | 3/2001 | Dye et al. |
| 7,233,265 | B2 | 6/2007 | Cockburn et al. |
| 2013/0021178 | A1* | 1/2013 | Jaquette .................. H03M 7/30 341/67 |

FOREIGN PATENT DOCUMENTS

WO   WO2011062764   5/2011

OTHER PUBLICATIONS

Janaki et al "A Novel Approach for a High Performance Lossless Cache Compression Algorithm" ARPN Journal of Engineering and Applied Sciences vol. 10 No. 7 Apr. 2015.

* cited by examiner

*Primary Examiner* — Baboucarr Faal
(74) *Attorney, Agent, or Firm* — Sheridan Ross P.C.

(57) ABSTRACT

Systems and methods relating generally to data storage, and more particularly to systems and methods for encoding to modify the size of an information set.

20 Claims, 8 Drawing Sheets

SYSTEMS AND METHODS FOR HIGH THROUGHPUT MULTI-INPUT COMPRESSION

FIELD OF THE INVENTION

Systems and methods relating generally to data storage, and more particularly to systems and methods for encoding to modify the size of an information set.

BACKGROUND

In some cases, it is desirable to reduce the size of a data set stored to a storage medium. Such reduction can often be limited by circuit layout and signal propagation constraints.

Hence, for at least the aforementioned reasons, there exists a need in the art for area and propagation efficient systems and methods for modifying the size of a data set.

SUMMARY

Systems and methods relating generally to data storage, and more particularly to systems and methods for encoding to modify the size of an information set.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS

Figure 1:
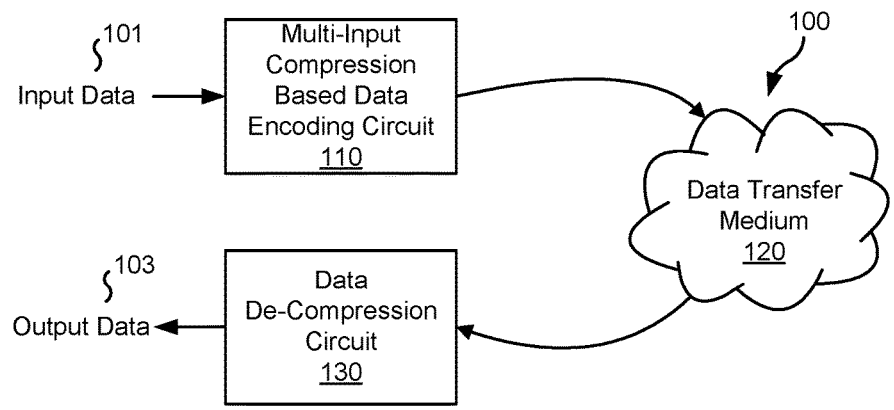
FIG. 1 is a block diagram of a data transfer system including a multi-input compression based encoding circuit in accordance with one or more embodiments of the present inventions.

Systems and methods relating generally to data storage, and more particularly to systems and methods for encoding to modify the size of an information set.

Some embodiments of the present inventions provide compression based data encoding systems that include: a FIFO, a portion matching circuit, and a segment matching circuit. The FIFO includes storage locations for N data portions where N is an integer value, and the FIFO is operable to store a series of N data portions. The portion matching circuit is operable to: shift each of the N data portions by K positions within the FIFO on each clock cycle; receive K input data portions where K is an integer value greater than one; and store the received K input data portions into the first K storage locations in the FIFO. In one or more instances of the aforementioned embodiments, the K input data portions are clocked into the FIFO on a single clock cycle. The portion matching circuit is operable to: compare a first input data portion with each of the N data portions in the FIFO to yield a match set[1]; and for each of the K input data portions indicated as K[i] (where i is an integer value between two and K), compare K[i] with each of K[1] to K[i−1] and the most recent N−(i−1) data portions in the FIFO to yield a match set[i]. Comparing the K[i] with each of K[1] to K[i−1] and the most recent N−(i−1) data portions in the FIFO is done in parallel with comparing the first input data portion with each of the N data portions in the FIFO. The segment matching circuit is operable to: receive match set[1] and match set[i]; identify a series of at least M preceding data portions including a subset of the input data portions, where M is an integer value; and generate a code indicating a number of data portions in the at least M incoming data portions and a distance between the at least M incoming data portions and the at least M preceding data portions.

In one or more instances of the aforementioned embodiments, the systems further include a backend encoder circuit. This backend encoder circuit is operable to replace the at least M data succeeding data portions with the code to yield an encoded output. In various instances of the aforementioned embodiments, the segment matching circuit includes: a portion sequence matching circuit, a register circuit, and a codeword formation circuit. The portion sequence matching circuit is operable to: receive the match set[1] through match set[K], historical match sets; determine based upon a subset of the match set[1] through the match set[K], and the historical match sets and generate sequence match indicators for a series of sequence of at least M consecutive data portion matches; and update the historical match sets based at least in part upon the sequence match indicators. The register circuit is operable to store the historical match sets. The codeword formation circuit is operable to generate the code. In some instances of the aforementioned embodiments, the segment matching circuit generates the code for a sequence match of at least M data portions during a single clock cycle.

In some cases, the value of N is 2048. In various cases, the value of M is three and the number of historical match sets is two. In one or more cases, the data portions are each eight bits. In one or more cases, the systems are implemented as part of a storage device, and/or as part of an integrated circuit.

Various embodiments of the present inventions provide compression based data encoding systems that include: a FIFO, a portion matching circuit, and a segment matching circuit. The FIFO is operable to store a series of N data portions. In one or more instance of the aforementioned embodiments, two or more data portions are clocked into the FIFO on a single clock cycle. The portion matching circuit is operable to: compare a first input data portion with each of the N data portions in the FIFO to yield a first match set; and compare a second input data portion with the first input data portion and the most recent N−1 data portions in the FIFO to yield a second match set. Comparing the second input data portion with the first input data portion and the most recent N−1 data portions in the FIFO is done in parallel with comparing the first input data portion with each of the N data portions in the FIFO. The segment matching circuit is operable to: receive the first match set and the second match set; identify a series of at least M preceding data portions within the N data portions of the FIFO that match a sequence of at least M data succeeding data portions; and generate a code indicating a number of data portions in the at least M data succeeding data portions and a distance between the at least M data succeeding data portions and the at least M preceding data portions.

In some cases, the value of N is 2048. In various cases, the value of M is three. In one or more cases, the data portions are each eight bits. In one or more cases, the systems are implemented as part of a storage device, and/or as part of an integrated circuit.

In one or more instances of the aforementioned embodiments, the systems further include a backend encoder circuit. This backend encoder circuit is operable to replace the at least M data succeeding data portions with the code to yield an encoded output. In various instances of the aforementioned embodiments, the segment matching circuit includes: a portion sequence matching circuit, a register circuit, and a codeword formation circuit. The portion sequence matching circuit is operable to: receive the first match set, the second match set, a first historical match set, and a second historical match set; determine that a subset of the first match set, the second match set, the first historical match set, and the second historical match set indicate a sequence of at least M data portions and generate a sequence match indication; and update the first historical match set and the second historical match set based at least in part upon the sequence match indication. The register circuit is operable to store the first historical match set and the second historical match set. The codeword formation circuit is operable to generate the code. In some instances of the aforementioned embodiments, the segment matching circuit generates the code during a single clock cycle. In one or more cases in the aforementioned instances, the first input data portion and the second input data portion are clocked into the FIFO on a single clock cycle.

In some instances of the aforementioned embodiments, the segment matching circuit includes: a portion sequence matching circuit, a register circuit, and a codeword formation circuit. The portion sequence matching circuit is operable to: receive the first match set, the second match set, a first historical match set, and a second historical match set; based at least in part on a subset of a combination of the first match set, the second match set, a first historical match set, and a second historical match set, determine a set of sequence match indicators corresponding to a list of sequences of at least M incoming data portions including a subset of the input data portions and a subset of data portions corresponding to the historical match sets; select a subset of the sequence match indicators to yield selected valid sequence match indicators; based upon the selected valid sequence match indicators, generated valid data portion sequence matches; and update the first historical match set and the second historical match set based at least in part upon the selected valid sequence match indicators to yield a first updated historical match set and a second updated historical match set. The segment matching circuit further includes: a register circuit operable to store the first updated historical match set and the second updated historical match set; and a codeword formation circuit operable to generate the code indicating a number of data portions in a selected valid sequence match of at least M incoming data portions and a distance between the at least M incoming data portions and the at least M preceding data portions.

Other embodiments of the present inventions provide methods for compression based data encoding. The methods include: providing a FIFO of a length N and operable to store N data portions; comparing a first input data portion with each of the N data portions in the FIFO to yield a first match set; comparing a second input data portion with each of the first input data portion and the most recent N−1 data portions in the FIFO to yield a second match set, where comparing the second input data portion with each of the first input data portion and the most recent N−1 data portions in the FIFO is done in parallel with comparing the first input data portion with each of the N data portions in the FIFO; identifying a series of at least M preceding data portions within the N data portions of the FIFO that match a sequence of at least M incoming data portions; and generating a code indicating a number of data portions in the at least M incoming data portions and a distance between the at least M incoming data portions and the at least M preceding data portions.

In some instances of the aforementioned embodiments, identifying a series of at least M preceding data portions within the N data portions of the FIFO that match a sequence of at least M incoming data portions and generating the code is done during a single clock cycle. In some such instances, the methods further include storing both the first input data portion and the second input data portion to the FIFO during a single clock cycle.

Turning to FIG. 1, a block diagram of a data transfer system 100 including a multi-input compression based encoding circuit 110 and a data decoding circuit 130 in accordance with one or more embodiments of the present inventions. Multi-input compression based encoding circuit 110 receives an input data set 101. Input data set 101 can be received from any number of sources including, but not limited to, a host device seeking to transfer information via data transfer system 100. Multi-input compression based encoding circuit 110 processes the received data to yield a transfer data set which is transferred to data decoding circuit 130 via a data transfer medium 120. Data transfer medium 120 may be any media or combination of media capable of transferring a data set including, but not limited to, a storage medium, a wireless communication medium, a wired communication medium, or the like. Based upon the disclosure provided herein, one of ordinary skill in the art will recognize a variety of transfer media that may be used in relation to different embodiments of the present inventions.

The processing applied by multi-input compression based encoding circuit 110 encodes the data set to yield a transfer data set of reduced size. The compression based data encoding may be performed using a circuit similar to that discussed below in relation to FIGS. 3*a*-3*e* and 5, and/or using the method discussed below in relation to FIG. 4. Data decoding circuit 130 operates to reverse the encoding applied by multi-offset compression based encoding circuit 110.

Figure 2:
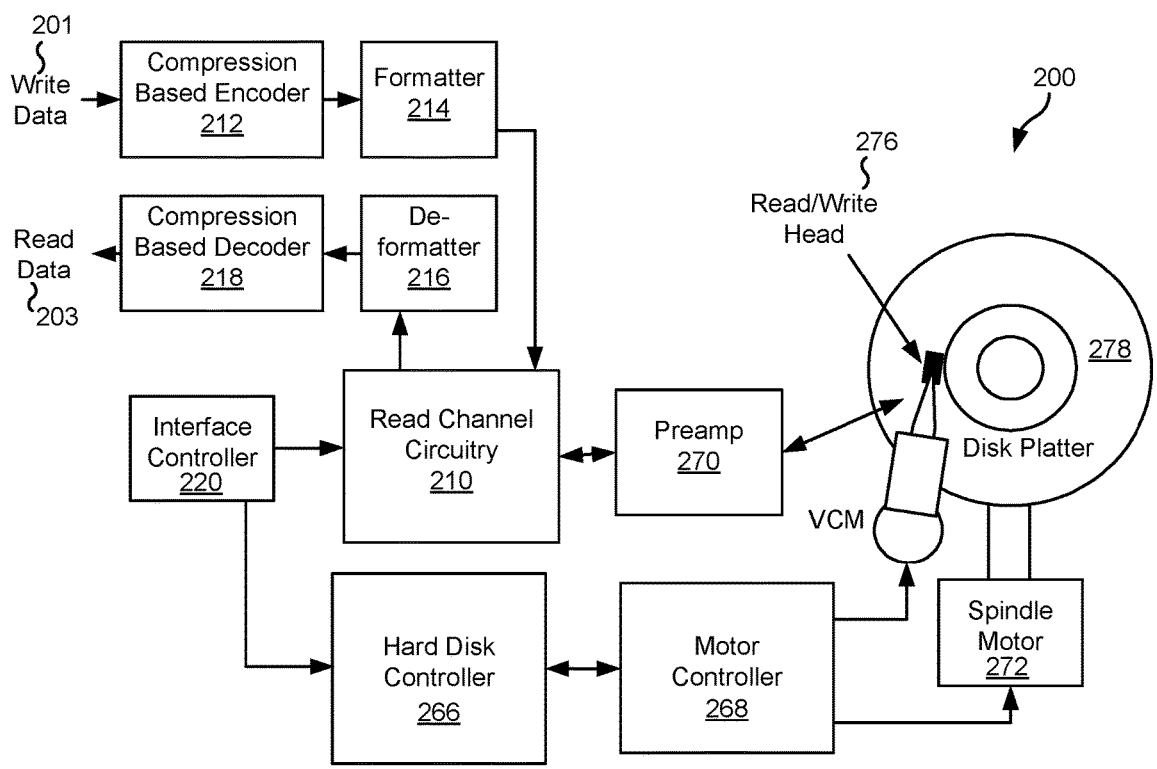
FIG. 2 shows a storage system that includes a read channel having multi-offset compression based data encoding circuitry in accordance with some embodiments of the present inventions.

Turning to FIG. 2, a storage system 200 is shown that includes a multi-input compression based encoder circuit 212 and a formatter circuit 214 that receives data to be stored to a disk platter 278. Multi-input compression based encoder 212 may be implemented using a circuit similar to that discussed below in relation to FIGS. 3*a*-3*e* and 5, and/or using the method discussed below in relation to FIG. 4. The compression based encoding is applied by compression based encoder circuit 212 to write data 201, and a resulting compression based encoded output is provided to formatter circuit 214 which operates to place the data in lengths appropriate for a data encoder circuit included as part of read channel circuitry 210. Storage system 200 may be, for example, a hard disk drive. Storage system 200 also includes an interface controller 220, a hard disk controller 266, a motor controller 268, a spindle motor 272, and a disk platter 278. A read/write head 276 is disposed in relation to disk platter 278 such that the read sensor and write head included in read/write head 276 are disposed over a track.

Interface controller 220 controls addressing and timing of data to/from disk platter 278, and interacts with a host controller (not shown). The data on disk platter 278 consists of groups of magnetic signals that may be detected by read/write head assembly 276 when the assembly is properly positioned over disk platter 278. In one embodiment, disk platter 278 includes magnetic signals recorded in accordance with either a longitudinal or a perpendicular recording scheme.

In a typical read operation, read/write head 276 is accurately positioned by motor controller 268 over a desired data track on disk platter 278. Motor controller 268 both positions read/write head 276 in relation to disk platter 278 and drives spindle motor 272 by moving read/write head assembly 276 to the proper data track on disk platter 278 under the direction of hard disk controller 266. Spindle motor 272 spins disk platter 278 at a determined spin rate (RPMs). Once read/write head 276 is positioned adjacent the proper data track, magnetic signals representing data on disk platter 278 are sensed by each of the sensors included in read/write head 276 as disk platter 278 is rotated by spindle motor 272. The sensed magnetic signals are provided as a continuous, minute analog signal representative of the magnetic data on disk platter 278 with a signal stream being provided from each of the multiple sensors. These minute analog signals are transferred from read/write head 276 to read channel circuit 210 via preamplifier 270. Preamplifier 270 is operable to amplify the respective minute analog signals accessed from disk platter 278. In turn, read channel circuit 210 processes the multiple amplified signals including combining the signals and applying data processing including, but not limited to, detection and/or decoding to the combined signals to recreate the information originally written to disk platter 278. The read data is provided to a de-formatter circuit 216 which substantially reverses the processes previously applied by formatter circuit 214 to yield a de-formatted output that is provided to a compression based decoder circuit 218. Compression based decoder circuit 218 reverses the compression based encoding previously applied by compression based encoder circuit 212 to yield read data 203.

It should be noted that storage system 200 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 200, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

An additional data encoder and data decoder circuit used in relation to read channel circuit 210 may be included. This additional circuit may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 200 may be modified to include solid state memory that is used to store data in addition to the storage offered by disk platter 278. This solid state memory may be used in parallel to disk platter 278 to provide additional storage. In such a case, the solid state memory receives and provides information directly to read channel circuit 210. Alternatively, the solid state memory may be used as a cache where it offers faster access time than that offered by disk platted 278. In such a case, the solid state memory may be disposed between interface controller 220 and read channel circuit 210 where it operates as a pass through to disk platter 278 when requested data is not available in the solid state memory or when the solid state memory does not have sufficient storage to hold a newly written data set. Based upon the disclosure provided herein, one of ordinary skill in the art will recognize a variety of storage systems including both disk platter 278 and a solid state memory.

Figure 3A:
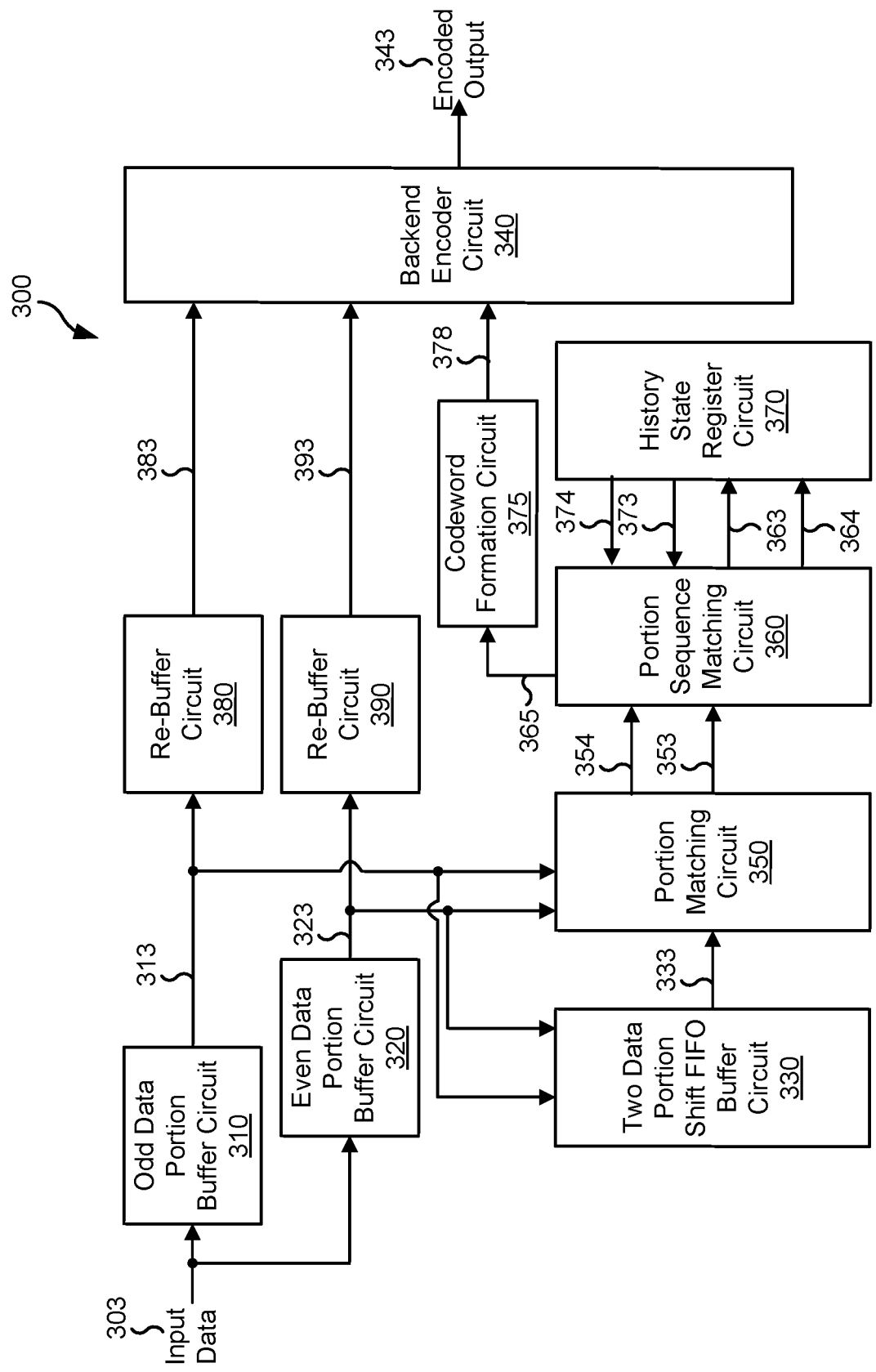
FIG. 3*a* is a two input compression based data encoding circuit in accordance with various embodiments of the present inventions.

Turning to FIG. 3a, a two input compression based data encoding circuit 300 is shown in accordance with various embodiments of the present inventions. Two input compression based data encoding circuit 300 includes an odd data portion buffer 310 and an even data portion buffer 320. Each of odd data portion buffer 310 and even data portion buffer 320 receive a serial data stream as input data 303. On each clock cycle, two consecutive portions of input data 303 are clocked into each of odd data portion buffer 310 and an even data portion buffer 320, with an the first of the two consecutive portions being clocked into even data portion buffer 320 and the second of the two consecutive portions being clocked into odd data portion buffer 310. Thus, two data portions are clocked in on each clock cycle. In some cases, the aforementioned two portions are two eight bit bytes. In other cases, the aforementioned two portions are two sixteen bit words. Based upon the disclosure provided herein, one of ordinary skill in the art will recognize other sizes of portions that may be used in relation to different embodiments of the present inventions.

The portion of input data 303 clocked into even data portion buffer 320 is the next contiguous portion to a string of data portions previously received, and the portion of input data 303 clocked into odd data portion buffer circuit 320 is the next contiguous portion after the portion clocked into even data portion buffer circuit 310.

On the same clock cycle that input data 303 is loaded into odd data portion buffer circuit 310 and even data portion buffer circuit 320, an odd data portion 313 previously stored in odd data portion buffer circuit 310 is transferred to the most recent odd location in two data portion shift FIFO buffer circuit 330 and an even data portion 323 previously stored in even data portion buffer circuit 320 is transferred to the most recent even location in two data portion shift FIFO buffer circuit 330 such that the order of data received as input data 303 is maintained in two data portion shift FIFO buffer circuit 330. On the same clock cycle, each succeeding element of two data portion shift FIFO buffer circuit 330 is shifted two positions to accommodate the two new portions being transferred from odd data portion buffer circuit 310 and even data portion buffer circuit 320 into two data portion shift FIFO buffer circuit 330. As such, odd data portions always assume an odd location and even data portions always assume an even location within two data portion shift FIFO buffer circuit 330. In some embodiments of the present inventions, two data portion shift FIFO buffer circuit 330 holds a total of 2048 data portions (i.e., 1024 even data portions and 1024 odd data portions). On each clock cycle two data portions are transferred out of the end of two data portion shift FIFO buffer circuit 330.

Also on the same clock cycle that input data 303 is loaded into odd data portion buffer circuit 310 and even data portion buffer circuit 320, odd data portion 313 previously stored in odd data portion buffer circuit 310 is transferred to a re-buffer circuit 380 and even data portion 323 previously stored in even data portion buffer circuit 320 is transferred to a re-buffer circuit 390. The data stored in re-buffer circuit 380 is made available to a backend encoder circuit 340 as a data portion 383, and the data stored in re-buffer circuit 390 is made available to backend encoder circuit 340 as a data portion 393.

Each of the data portions in two data portion shift FIFO buffer circuit 330 are provided as an N-portion FIFO output 333 to a portion matching circuit 333 along with odd data portion 313 and even data portion 323. On each clock cycle, even data portion 323 (i.e., the data portion stored in even portion data buffer circuit 320) is compared in parallel to all elements of N-portion FIFO output 333 (i.e., to the data in all N positions of two data portion shift FIFO buffer circuit 330) to yield a first match array with a binary '1' for each position a match is found and a binary '0' for each position where a match does not occur, and odd data portion 313 (i.e., the data portion stored in odd portion data buffer circuit 310) is compared in parallel to even data portion 323 (i.e., the data portion stored in even portion data buffer circuit 320) and the most recent N−1 elements of N-portion FIFO output 333 (i.e., to the most recent N−1 positions of two data portion shift FIFO buffer circuit 330) to yield a second match array with a binary '1' for each position a match is found and a binary '0' for each position where a match does not occur. The first match array is provided to a portion sequence matching circuit 360 as a CMatch0[N−1:0] output 354, and the second match array is provided to portion sequence matching circuit 360 as a CMatch1[N−1:0] output 353.

Figure 3B:
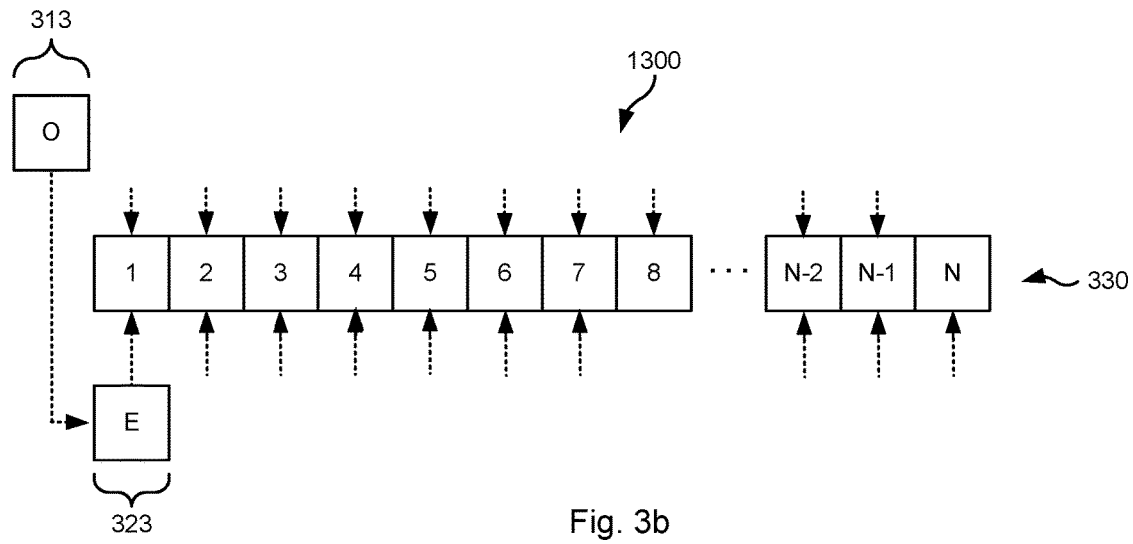
FIG. 3*b* graphically shows the multiple parallel comparison processes ongoing during the operation of the two input compression based data encoding circuit of FIG. 3*a*.

Turning to FIG. 3b, the aforementioned multiple parallel comparison processes ongoing during the operation of the two input compression based data encoding circuit of FIG. 3a is shown. As shown, odd data portion 313 is compared with both even data portion 323 and the most recent N−1 elements (i.e., {1, 2, 3, 4, 5, 6, 7, 8 . . . N−2, N−1}) of two data portion shift FIFO buffer circuit 330, and even data portion 323 is compared with all N elements (i.e., {1, 2, 3, 4, 5, 6, 7, 8 . . . N−2, N−1, N}) of two data portion shift FIFO buffer circuit 330.

Figure 3D:
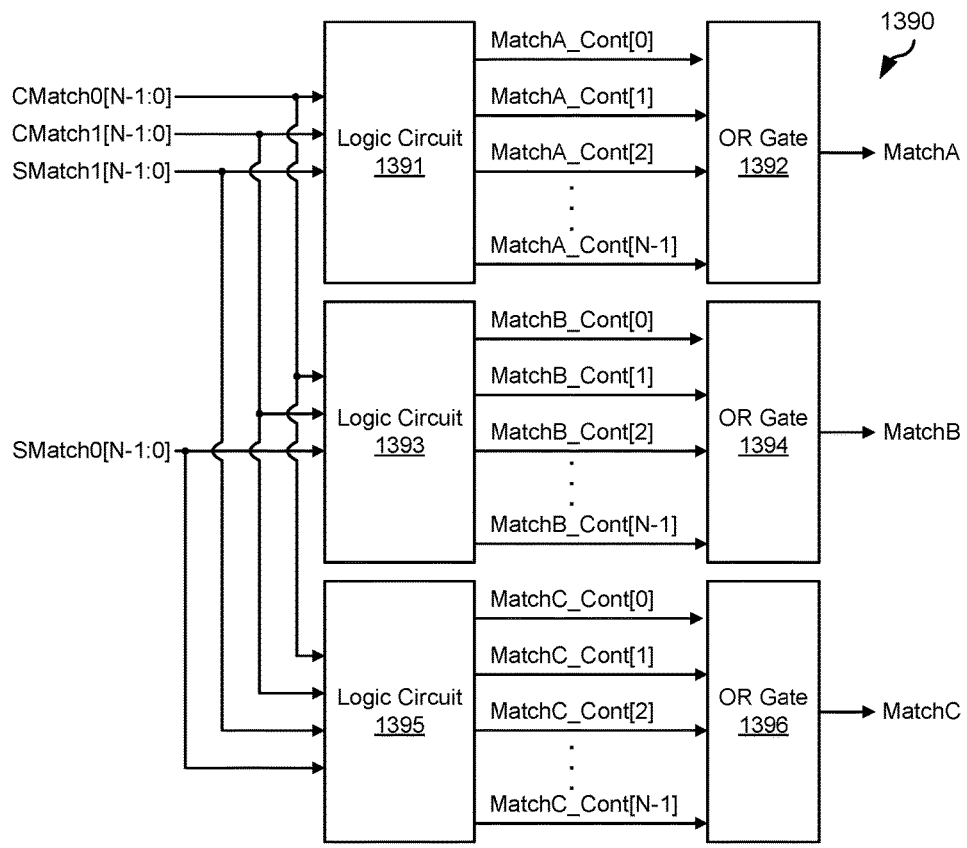
FIG. 3*d* shows one implementation of the portion matching circuit of FIG. 3*a* in accordance with one or more embodiments of the present inventions.
Figure 3C:
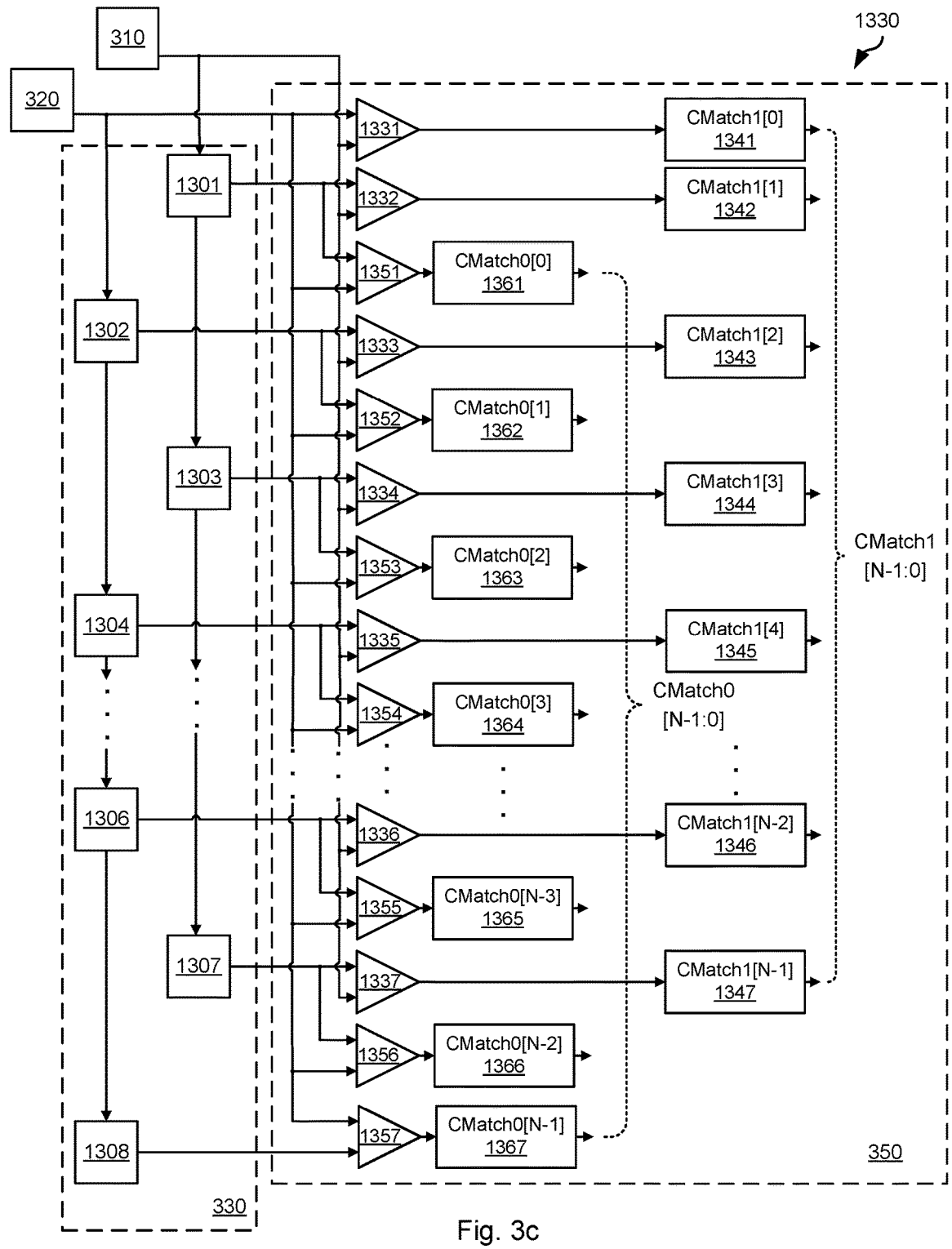
FIG. 3*c* shows one implementation of the portion sequence matching circuit of FIG. 3*a* in accordance with one or more embodiments of the present inventions.

Turning to FIG. 3c, one implementation of the combination of: odd data portion buffer circuit 310, even data portion buffer circuit 320, two data portion shift FIFO buffer circuit 330, and portion sequence matching circuit 350 of FIG. 3a is shown in accordance with one or more embodiments of the present inventions. As shown, odd data portion buffer circuit 310 feeds an odd string of FIFO locations (i.e., FIFO location 1301, FIFO location 1303, . . . and FIFO location 1307) within two data portion shift FIFO buffer circuit 330, and even data portion buffer circuit 320 feeds an even string of FIFO locations (i.e., FIFO location 1302, FIFO location 1304, . . . FIFO location 1306, and FIFO location 1308) within two data portion shift FIFO buffer circuit 330. FIFO location 1301 corresponds to position '1' in FIG. 3b, and FIFO location 1308 corresponds to position 'N' in FIG. 3b. On each clock cycle, the data in each of FIFO locations 1301, 1302, 1303, 1304, 1306 are shifted to the next location in the respective even and odd string, and the data in each of FIFO locations 1307, 1308 are shifted out of two data portion shift FIFO buffer circuit 330.

The data in odd data portion buffer circuit 310 is provided to a numbed of comparators 1331, 1332, 1333, 1334, 1335, 1336 and 1337 where the respective comparisons between the data in odd data portion buffer circuit 310 and both the data in even data portion buffer circuit 320 and the most recent N−1 elements of two data portion shift FIFO buffer circuit 330 are performed, and the data in even data portion buffer circuit 320 is provided to a numbed of comparators 1351, 1352, 1353, 1354, 1355, 1356 and 1357 where the respective comparisons between the data in even data portion buffer circuit 320 and the N elements of two data portion shift FIFO buffer circuit 330 are performed. The results of the aforementioned comparisons with the data in odd data portion buffer circuit 310 are clocked into respective CMatch1 registers (CMatch1[0] 1341, CMatch1[1] 1342, CMatch1[2] 1343, CMatch1[3] 1344, CMatch1[4] 1345 . . . CMatch1[N–2] 1346, and CMatch1[N–1] 1347). Similarly, the results of the aforementioned comparisons with the data in even data portion buffer circuit 320 are clocked into respective CMatch0 registers (CMatch[0] 1361, CMatch0[1] 1362, CMatch0[2] 1363, CMatch0[3] 1364 . . . CMatch0[N–3] 1365, CMatch0[N–1] 1366, and CMatch0 [N–1] 1367). The outputs of the respective CMatch0 and CMatch1 registers are provided as CMatch0 [N–1:0] output 353 and CMatch1 [N–1:0] output 354.

Returning to FIG. 3a, portion sequence matching circuit 360 determines whether the matches indicated in CMatch0 [N–1:0] output 353 and CMatch1[N–1:0] output 354 are associated with longer chains of matches. In this embodiment, portion sequence matching circuit 360 is looking for matches between series of three or more data portions, and where such is found, an identification of the length and location of the match is provided as a match indicator output 365 to a codeword formation circuit 375. In turn, codeword formation circuit 375 generates a code to be used in place of the later of the identified matching segments. This code includes an encoded flag plus a length and offset where the length is the number of consecutive data portions that were matched and the offset is the number of data portions separating the two matching segments (this number corresponds to the instance within the FIFO of the matching data portions). This code is provided as a code output 378 to backend encoder circuit 340.

To perform the matching sequence determination by portion sequence matching circuit 360, information about previous matches are stored in a history state register circuit 370. The history maintained in the history state register circuit 370 is provided as a prior match outputs 363, 364 that are generated by portion sequence matching circuit 360. The maintained history information is provided from history state register circuit 370 to portion sequence matching circuit 360 as an SMatch0 output 373 and an SMatch1 output 374 which are each array outputs with a logic '1' in the respective array at locations where prior match sequences were identified, and a logic '0' in the respective array at locations where prior match sequences were not identified.

In particular, portion sequence matching circuit 360 generates a listing of match sequences based upon a combination of historical match information (i.e., SMatch1[N–1:0] output 374 and SMatch0[N–1:0] output 373) and current match information (i.e., CMatch1[N–1:0] output 354 and CMatch0[N–1:0] output 353). The generated match sequences include: a MatchA, a MatchB, a MatchC, and no match. MatchC indicates a continuing match of at least four consecutive data portions in length, MatchB indicates a continuing match of at least three consecutive data portions in length, and MatchA indicating a discontinued match of at least three consecutive data portions in length. The following pseudocode shows the generation of MatchA, MatchB, and MatchC:

```
If      (CMatch0[0] && CMatch1[0] && SMatch0[0] &&
         SMatch1[0] OR
           CMatch0[1] && CMatch1[1] && SMatch0[1] &&
           SMatch1[1] OR
           CMatch0[2] && CMatch1[2] && SMatch0[2] &&
           SMatch1[2] . . .
           CMatch0[N-2] && CMatch1[N-2] && SMatch0[N-2]
           && SMatch1[N-2] OR
           CMatch0[N-1] && CMatch1[N-1] && SMatch0[N-1]
           && SMatch1[N-1])
        {
           Assert MatchC
        }
Else If (CMatch0[0] && SMatch0[0] && SMatch1[0] OR
           CMatch0[1] && SMatch0[1] && SMatch1[1] OR
           CMatch0[2] && SMatch0[2] && SMatch1[2] . . .
           CMatch0[N-2] && SMatch0[N-2] && SMatch1[N-2] OR
           CMatch0[N-1] && SMatch0[N-1] && SMatch1[N-1])
        {
           Assert MatchB
        }
Else If (CMatch0[0] && CMatch1[0] && SMatch1[0] OR
           CMatch0[1] && CMatch1[1] && SMatch1[1] OR
           CMatch0[2] && CMatch1[2] && SMatch1[2] . . .
           CMatch0[N-2] && CMatch1[N-2] && SMatch1[N-2] OR
           CMatch0[N-1] && CMatch1[N-1] && SMatch1[N-1])
        {
           Assert MatchA
        }
Else {
        De-Assert All of MatchA, MatchB and MatchC
     }
```

Portion sequence matching circuit 360 calculates prior match outputs 363, 364 which are received by history state register circuit 370 and used to update the historical match information (i.e., SMatch1[N–1:0] output 374 and SMatch0 [N–1:0] output 373). Prior art match outputs 363, 364 are based upon the aforementioned MatchC, MatchB and MatchA data, and result in the updating of the historical match information in accordance with the following pseudocode:

```
For (i = 0 to N-1){
    If (MatchC is Asserted){
        SMatch0[i] = CMatch0[i] && CMatch1[i] && SMatch0[i]
            && SMatch1[i];
        SMatch1[i] = CMatch0[i] && CMatch1[i] && SMatch0[i]
            && SMatch1[i]
    }
    Else If (MatchB is Asserted){
        SMatch0[i] = CMatch0[i] && SMatch0[i] && SMatch1[i];
        SMatch1[i] = CMatch1[i]
    }
    Else If (MatchA is Asserted){
        SMatch0[i] = CMatch0[i] && CMatch1[i] && SMatch1[i];
        SMatch1[i] = CMatch0[i] && CMatch1[i] && SMatch1[i];
    }
    Else {
        SMatch0[i] = CMatch0[i];
        SMatch1[i] = CMatch1[i]
    }
}
```

Where neither MatchB nor MatchC is asserted, but MatchA is asserted, the end of a match (i.e., a discontinuity in the match) is indicated. When such an end of match is indicated, all of the sequentially matching portions included in the discontinuing match are encoded using compression based encoding. In this case, portion sequence matching circuit 360 provides an identification of the length and location of the match as match indicator output 365 to codeword formation circuit 375.

Turning to FIG. 3d, one implementation of a part 1390 of portion matching circuit 360 of FIG. 3a is shown in accordance with one or more embodiments of the present inventions. As shown, three logic circuits (i.e., a logic circuit 1391, a logic circuit 1393 and a logic circuit 1395) receive both the current match information (i.e., CMatch1[N−1:0] output 354 and CMatch0[N−1:0] output 353) and the historical match information (i.e., SMatch1[N−1:0] output 374 and SMatch0[N−1:0] output 373). Logic circuit 1391 generates the logical outputs for a match at each of the locations (i.e., 0 to N−1). The logic implemented in accordance with the following pseudocode:

```
For (i=1 to N-1){
    MatchA_Cont[i] = CMatch0[i] && CMatch1[i] && SMatch1[i]
}
```

Whenever one of MatchA_Cont[i] is set to a logic '1', it indicates that the two most recently received data portions (i.e., odd data portion 313 and even data portion 323) and one other data portion are found in sequence. This can represent either the continuation of a match that is now at least three data portions in length, or the start of a match that is now at least three data portions in length. It should be noted that matches of two consecutive data portions or four or more consecutive data portions may be accommodated in different embodiments. Logic circuit 1393 generates the logical outputs for a match at each of the locations (i.e., 0 to N−1). The logic implemented in accordance with the following pseudocode:

```
For (i=1 to N-1){
    MatchB_Cont[i] = CMatch0[i] && SMatch0[i] && SMatch1[i]
}
```

Whenever one of MatchB_Cont[i] is set to a logic '1', it indicates that one of the most recently received data portion (i.e., even data portion 323) and two other data portions are found in sequence. This can represent either the continuation of a match that is now at least three data portions in length, or the end of a match that is now at least three data portions in length. Again, it should be noted that matches of two consecutive data portions or four or more consecutive data portions may be accommodated in different embodiments. Logic circuit 1395 generates the logical outputs for a match at each of the locations (i.e., 0 to N−1). The logic implemented in accordance with the following pseudocode:

```
For (i=1 to N-1){
    MatchC_Cont[i] = CMatch0[i] && CMatch1[i] && SMatch0[i]
        && SMatch1[i]
}
```

Whenever one of MatchC_Cont[i] is set to a logic '1', it indicates that both of the most recently received data portions (i.e., odd data portion 313 and even data portion 323) and two preceding data portions are found in sequence. This can represent either the continuation of a match that is now at least four data portions in length, the beginning of a match that is now at least four data portions in length, or the end of a match that is now at least four data portions in length. Again, it should be noted that matches of two consecutive data portions or four or more consecutive data portions may be accommodated in different embodiments.

An 'OR' gate 1392 logically 'ORs' all of the MatchA_Cont[i] to yield a MatchA output. An 'OR' gate 1394 logically 'ORs' all of the MatchB_Cont[i] to yield a MatchB output. An 'OR' gate 1396 logically 'ORs' all of the MatchC_Cont[i] to yield a MatchC output.

Returning to FIG. 3a, backend encoder circuit 340 uses the combination of code output 378, data portion 383, and data portion 393 to generated an encoded output 343. In particular, where data portion 383 or data portion 393 are not associated with a match, or are associated with the first instance of the matched sequence, the data portion is augmented to begin with a non-encoded flag (e.g., a '1'). Alternatively, where data portion 383 or data portion 393 are associated with the second instance of the matched sequence, the data portion (along with other data portions in the second instance of the match) are replaced by code output 378.

Figure 3E:
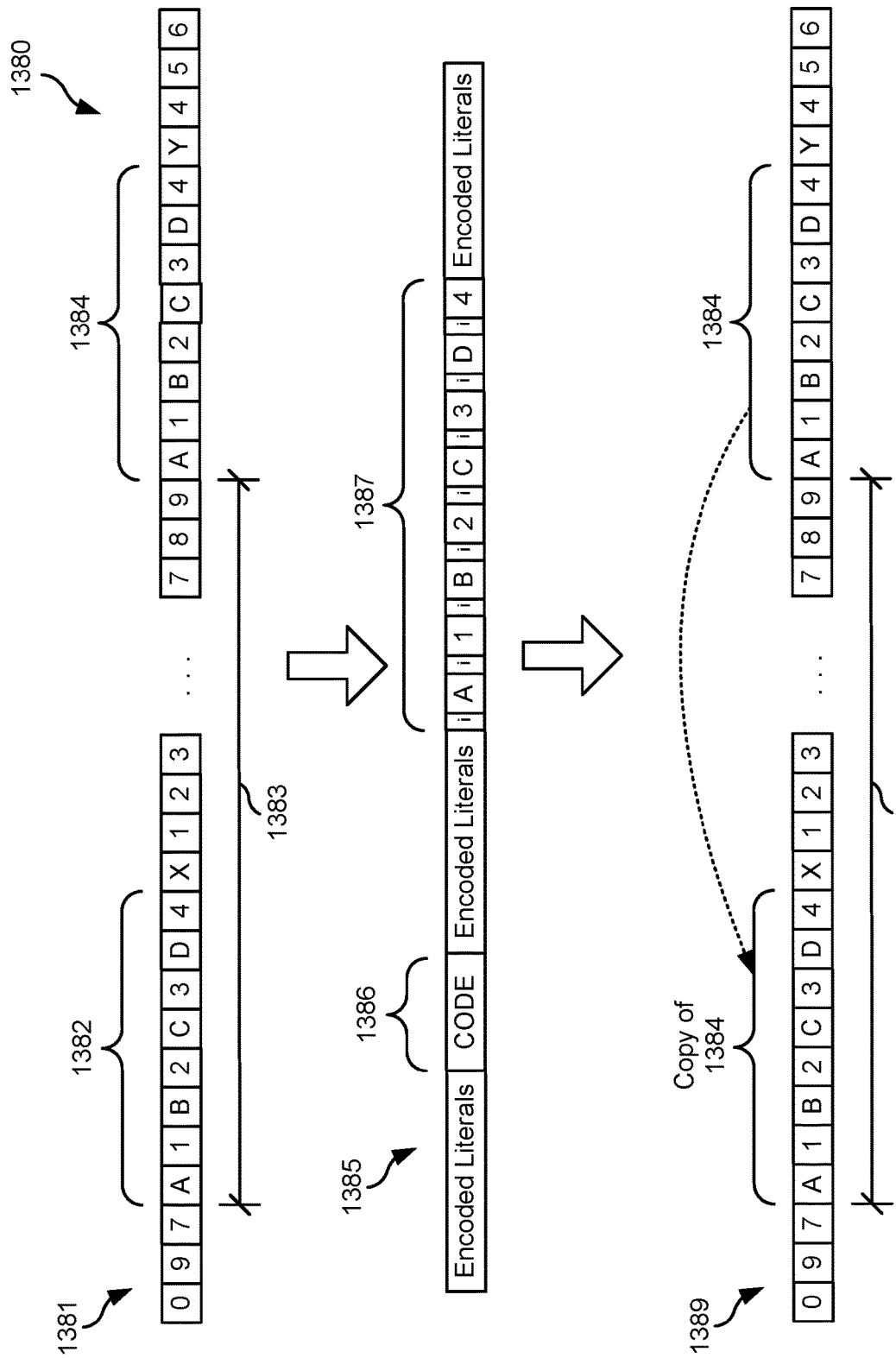
FIG. 3*e* graphically shows the replacement of a current match string with a code of shorter length to yield an encoded output, and to subsequently replace the code with the current match string.

Turning to FIG. 3e, an example of the encoding performed by two input compression based data encoding circuit 300 discussed above in relation to FIG. 3a and the subsequent decoding is graphically depicted in a graphic 1380. A data input 1381 is shown that includes a series of data portions received in the following order {6, 5, 4, Y, 4, D, 3, C, 2, B, 1, A, 9, 8, 7 . . . 3, 2, 1, X, 4, D, 3, C, 2, B, 1, A, 7, 9, 0 . . . }. When the {X, 1} series of data portions are received, the 'X' is stored in odd data portion buffer circuit 310 (labeled "O" in FIG. 3b) and the '1' is stored in even data portion buffer circuit 320 (labeled "E" in FIG. 3b). The 'X' in the even register is compared in parallel with all elements stored in the N position FIFO, and the '1' in the odd register is compared with the 'X' in the even register along with the first N−1 positions in the N position FIFO. In this case, there is no other match for 'X', but the '1' matches another '1' within the FIFO, but there are no prior matches (i.e., SMatch1 and SMatch0 are de-asserted. In this situation, all of MatchA, MatchB and Match C are de-asserted, and the next instances of SMatch0[Location of '1'] is set equal to CMatch0[Location of the '1'], and all other SMatch0 and SMatch1 are set equal to zero.

On the next clock the {D, 4} series of data portions are received, and the 'D' is stored in odd data portion buffer circuit 310 (labeled "O" in FIG. 3b) and the '4' is stored in even data portion buffer circuit 320 (labeled "E" in FIG. 3b). The '4' in the even register is compared in parallel with all elements stored in the N position FIFO, and the 'D' in the odd register is compared with the '4' in the even register along with the first N−1 positions in the N position FIFO. There are two matches for the '4' and one match for the 'D'. In this case, CMatch0[location of the first '4'] and CMatch0 [location of the second '4'] are asserted, and CMatch1 [location of the 'D'] is asserted. The location of the 'D' and the location of the first '4' are the same locations (i.e., the same offset) within the FIFO. In this case, however, neither the SMatch1 nor SMatch0 for the location sequential to the first '4' are asserted. Because of this, all of MatchA, MatchB and Match C are de-asserted, and the next instances of SMatch1 [Location of 'D'] is set equal to CMatch1 [Location of the 'D'] and SMatch0[Location of the first '4'] is set equal to CMatch0[Location of the first '4']. All other SMatch0 and SMatch1 are set equal to zero.

On the next clock the {C, 3} series of data portions are received, and the 'C' is stored in odd data portion buffer circuit 310 (labeled "O" in FIG. 3b) and the '3' is stored in even data portion buffer circuit 320 (labeled "E" in FIG. 3b). The '3' in the even register is compared in parallel with all elements stored in the N position FIFO, and the 'C' in the odd register is compared with the '3' in the even register along with the first N−1 positions in the N position FIFO. There are two matches for the '3' and one match for the 'C'. In this case, CMatch0[location of the first '3'] and CMatch0 [location of the second '3'] are asserted, and CMatch1 [location of the 'C'] is asserted. The location of the 'C' and the location of the second '3' are the same locations (i.e., the same offset) within the FIFO. In this case, both the SMatch1 and the SMatch0 for the same locations (i.e., for the locations of the {D, 4}) are asserted. In this case, all of MatchA, MatchB and MatchC are asserted indicated a match of four sequential data elements (i.e., {C, 3, D, 4}). Because MatchC is asserted, SMatch1 [location of the 'C'] and SMatch0[location of the second '3'] are asserted.

On the next clock the {B, 2} series of data portions are received, and the 'B' is stored in odd data portion buffer circuit 310 (labeled "O" in FIG. 3*b*) and the '2' is stored in even data portion buffer circuit 320 (labeled "E" in FIG. 3*b*). The '2' in the even register is compared in parallel with all elements stored in the N position FIFO, and the 'B' in the odd register is compared with the '2' in the even register along with the first N−1 positions in the N position FIFO. There are two matches for the '2' and one match for the 'B'. In this case, CMatch0[location of the first '2'] and CMatch0 [location of the second '2'] are asserted, and CMatch1 [location of the 'B'] is asserted. The location of the 'B' and the location of the second '2' are the same locations (i.e., the same offset) within the FIFO. In this case, both the SMatch1 and the SMatch0 for the next locations in the FIFO (i.e., for the locations of the {C, 3}) are asserted. In this case, all of MatchA, MatchB and MatchC are asserted indicated a match of four sequential data elements (i.e., {B, 2, C, 3}). Because MatchC is asserted, SMatch1 [location of the 'B'] and SMatch0[location of the second '2'] are asserted.

On the next clock the {A, 1} series of data portions are received, and the 'A' is stored in odd data portion buffer circuit 310 (labeled "O" in FIG. 3*b*) and the '1' is stored in even data portion buffer circuit 320 (labeled "E" in FIG. 3*b*). The '1' in the even register is compared in parallel with all elements stored in the N position FIFO, and the 'A' in the odd register is compared with the '1' in the even register along with the first N−1 positions in the N position FIFO. There are three matches for the '1' and one match for the 'A'. In this case, CMatch0[location of the first '1'], CMatch0 [location of the second '1'] and CMatch0[location of the third '1'] are asserted, and CMatch1 [location of the 'A'] is asserted. The location of the 'A' and the location of the third '1' are the same locations (i.e., the same offset) within the FIFO. In this case, both the SMatch1 and the SMatch0 for the next locations in the FIFO (i.e., for the locations of the {B, 2}) are asserted. In this case, all of MatchA, MatchB and MatchC are asserted indicated a match of four sequential data elements (i.e., {A, 1, B, 2}). Because MatchC is asserted, SMatch1 [location of the 'A'] and SMatch0[location of the third '1'] are asserted.

On the next clock the {9, 7} series of data portions are received, and the '9' is stored in odd data portion buffer circuit 310 (labeled "O" in FIG. 3*b*) and the '7' is stored in even data portion buffer circuit 320 (labeled "E" in FIG. 3*b*). The '7' in the even register is compared in parallel with all elements stored in the N position FIFO, and the '9' in the odd register is compared with the '7' in the even register along with the first N−1 positions in the N position FIFO. There is one match for the '7' and one match for the '9'. In this case, CMatch0[location of the '7'] and CMatch1 [location of the '9'] are asserted. The location of the '9' and the location of the '7' are not the same locations. In this case, none of MatchA, MatchB, nor MatchC are asserted. Because of this, the previous matches indicated in SMatch0 and SMatch1 (i.e., {A, 1, B, 2, C, 3, D, 4}) are discontinuous and ready for encoding.

In particular, a matched location 1382 corresponds to the original location 1384 within the data stream. The non-matched locations are augmented to include a non-encoded flag (shown as 'i') and with the regions that are not encoded labeled "encoded literals" or shown as encoded literals 1387 corresponding to original location 1384. In contrast, matched location 1382 is encoded to include an encoded flag plus a length and offset. In this case, the length is eight (i.e., the number of literals within matched location that match those in original location 1384. The offset is the distance (i.e., number of data portions) between matched location 1382 and original location 1384, and is shown as an offset 1383. This combination of the encoded flag plus a length and offset are shown as a "CODE" 1386 in an encoded data stream 1385.

When encoded data stream 1385 is recovered, encoded literals 1387 is decoded by stripping the previously added non-encoded flags to yield the data from original location 1384. This same process is performed on all of the other encoded literals. When code 1386 is received, the length and offset information are used to identify the previously decoded data from original location 1384, and a copy of the data from the previously decoded data from original location 1384 is put in place of code 1386 to yield the data corresponding to matched location 1382.

Figure 4:
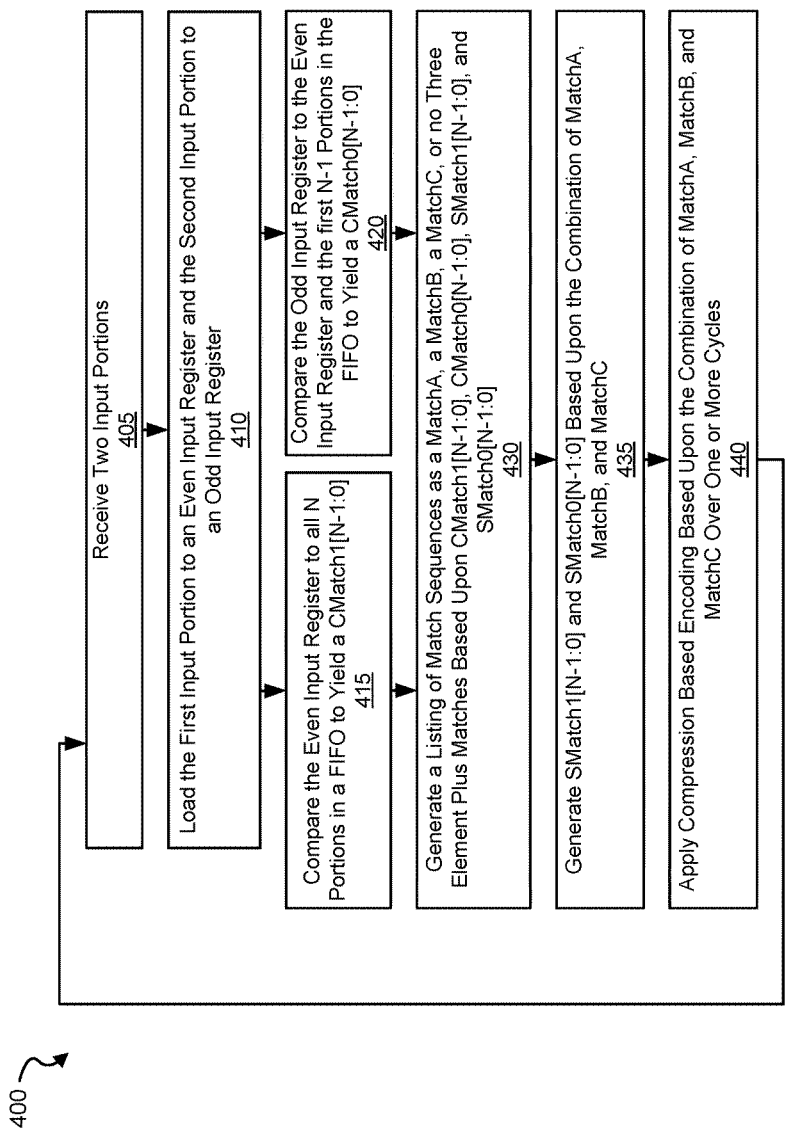
FIG. 4 is a flow diagram showing a method for compression based data encoding including parallel matching of two inputs in accordance with one or more embodiments of the present inventions.

Turning to FIG. 4, a flow diagram 400 shows a method for compression based data encoding including parallel matching of two inputs in accordance with one or more embodiments of the present inventions. Following flow diagram 400, two input portions (i.e., a first input portion and a second input portion) are received in parallel (block 405), and the first input portion is loaded into an even input register and the second input portion is loaded into an odd input register (block 410). In some embodiments, the first input portion is a first byte in a stream of data and the second input portion is a second byte immediately following the first byte in the stream of data.

The data maintained in the even input register is compared in parallel to all N entries in a FIFO with the resulting match information being stored to a match register as CMatch1[N−1:0] (block 415). At the same time (i.e., in parallel) the even input register is being compared in parallel to all N entries, the odd input register is compared in parallel to the even input register and the first N−1 entries in the FIFO with the resulting match information being stored to a match register as CMatch0[N−1:0] (bock 420).

A listing of match sequences are generated based upon a combination of historical match information (i.e., SMatch1 [N−1:0] and SMatch0[N−1:0]) and current match information (i.e., CMatch1 [N−1:0] and CMatch0[N−1:0]) (block 430). The generated match sequences include: a MatchA, a MatchB, a MatchC, and no match. MatchC indicates a continuing match of at least four consecutive data portions in length, MatchB indicates a continuing match of at least three consecutive data portions in length, and MatchA indicating a discontinued match of at least three consecutive data portions in length. The following pseudocode shows the generation of MatchA, MatchB, and MatchC:

```
If      (CMatch0[0] && CMatch1[0] && SMatch0[0] &&
        SMatch1[0] OR
            CMatch0[1] && CMatch1[1] && SMatch0[1] &&
            SMatch1[1] OR
            CMatch0[2] && CMatch1[2] && SMatch0[2] &&
            SMatch1[2] . . .
            CMatch0[N-2] && CMatch1[N-2] && SMatch0[N-2]
            && SMatch1[N-2] OR
            CMatch0[N-1] && CMatch1[N-1] && SMatch0[N-1]
            && SMatch1[N-1])
        {
            Assert MatchC
        }
Else If (CMatch0[0] && SMatch0[0] && SMatch1[0] OR
        CMatch0[1] && SMatch0[1] && SMatch1[1] OR
        CMatch0[2] && SMatch0[2] && SMatch1[2] . . .
        CMatch0[N-2] && SMatch0[N-2] && SMatch1[N-2] OR
        CMatch0[N-1] && SMatch0[N-1] && SMatch1[N-1])
        {
            Assert MatchB
        }
Else If (CMatch0[0] && CMatch1[0] && SMatch1[0] OR
        CMatch0[1] && CMatch1[1] && SMatch1[1] OR
        CMatch0[2] && CMatch1[2] && SMatch1[2] . . .
        CMatch0[N-2] && CMatch1[N-2] && SMatch1[N-2] OR
        CMatch0[N-1] && CMatch1[N-1] && SMatch1[N-1])
        {
            Assert MatchA
        }
Else {
        De-Assert All of MatchA, MatchB and MatchC
     }
```

The aforementioned historical match information (i.e., SMatch1[N−1:0] and SMatch0[N−1:0]) is generated for the next input portions based upon a combination of MatchA, MatchB and MatchC (block 435). In particular, SMatch1[N−1:0] and SMatch0[N−1:0] are generated in accordance with the following pseudocode:

```
For (i = 0 to N-1){
    If (MatchC is Asserted){
        SMatch0[i] = CMatch0[i] && CMatch1[i] && SMatch0[i]
        && SMatch1[i];
        SMatch1[i] = CMatch0[i] && CMatch1[i] && SMatch0[i]
        && SMatch1[i]
    }
    Else If (MatchB is Asserted){
        SMatch0[i] = CMatch0[i] && SMatch0[i] && SMatch1[i];
        SMatch1[i] = CMatch1[i]
    }
    Else If (MatchA is Asserted){
        SMatch0[i] = CMatch0[i] && CMatch1[i] && SMatch1[i];
        SMatch1[i] = CMatch0[i] && CMatch1[i] && SMatch1[i];
    }
    Else {
        SMatch0[i] = CMatch0[i];
        SMatch1[i] = CMatch1[i]
    }
}
```

Where neither MatchB nor MatchC is asserted, but MatchA is asserted, the end of a match (i.e., a discontinuity in the match) is indicated. When such an end of match is indicated, all of the sequentially matching portions included in the discontinuing match are encoded using compression based encoding (block 440). This compression based encoding starts with an encode flag (e.g., a '0') followed by the length (i.e., the number of data portions included in the match) and a distance from the matching element found within the FIFO. Where a data portion is not associated with a match, the data portion is augmented to begin with a non-encoded flag (e.g., a '1').

Turning again to FIG. 3*e*, the example of the encoding and decoding is provided in graphic 1380. Data input 1381 including a series of data portions received in the following order {6, 5, 4, Y, 4, D, 3, C, 2, B, 1, A, 9, 8, 7 . . . 3, 2, 1, X, 4, D, 3, C, 2, B, 1, A, 7, 9, 0 . . . } is shown. Following the method of FIG. 4, when the {X, 1} series of data portions are received, the 'X' is stored as the first portion (labeled "O" in FIG. 3*b*) and the '1' is stored as the second portion (labeled "E" in FIG. 3*b*). The 'X' in the even register is compared in parallel with all elements stored in the N position FIFO, and the '1' in the odd register is compared with the 'X' in the even register along with the first N−1 positions in the N position FIFO. In this case, there is no other match for 'X', but the '1' matches another '1' within the FIFO, but there are no prior matches (i.e., SMatch1 and SMatch0 are de-asserted. In this situation, all of MatchA, MatchB and Match C are de-asserted, and the next instances of SMatch1[Location of '1'] is set equal to CMatch1[Location of the '1'], and all other SMatch0 and SMatch1 are set equal to zero.

On the next clock the {D, 4} series of data portions are received, and the 'D' is stored as the first portion (labeled "O" in FIG. 3*b*) and the '4' is stored as the second portion (labeled "E" in FIG. 3*b*). The '4' in the even register is compared in parallel with all elements stored in the N position FIFO, and the 'D' in the odd register is compared with the '4' in the even register along with the first N−1 positions in the N position FIFO. There are two matches for the '4' and one match for the 'D'. In this case, CMatch0 [location of the first '4'] and CMatch0[location of the second '4'] are asserted, and CMatch1 [location of the 'D'] is asserted. The location of the 'D' and the location of the first '4' are the same locations (i.e., the same offset) within the FIFO. In this case, however, neither the SMatch1 nor SMatch0 for the location sequential to the first '4' are asserted. Because of this, all of MatchA, MatchB and Match C are de-asserted, and the next instances of SMatch1 [Location of 'D'] is set equal to CMatch1 [Location of the 'D'] and SMatch1 [Location of the second '3'] is set equal to CMatch2[Location of the first '4']. All other SMatch0 and SMatch1 are set equal to zero.

On the next clock the {C, 3} series of data portions are received, and the 'C' is stored as the first portion (labeled "O" in FIG. 3*b*) and the '3' is stored as the second portion (labeled "E" in FIG. 3*b*). The '3' in the even register is compared in parallel with all elements stored in the N position FIFO, and the 'C' in the odd register is compared with the '3' in the even register along with the first N−1 positions in the N position FIFO. There are two matches for the '3' and one match for the 'C'. In this case, CMatch0 [location of the first '3'] and CMatch0[location of the second '3'] are asserted, and CMatch1 [location of the 'C'] is asserted. The location of the 'C' and the location of the second '3' are the same locations (i.e., the same offset) within the FIFO. In this case, both the SMatch1 and the SMatch0 for the next locations in the FIFO (i.e., for the locations of the {D, 4}) are asserted. In this case, all of MatchA, MatchB and MatchC are asserted indicated a match of four sequential data elements (i.e., {C, 3, D, 4}). Because MatchC is asserted, SMatch0[location of the 'C'] and SMatch1 [location of the second '3'] are asserted.

On the next clock the {B, 2} series of data portions are received, and the 'B' is stored as the first portion (labeled "O" in FIG. 3*b*) and the '2' is stored as the second portion (labeled "E" in FIG. 3*b*). The '2' in the even register is compared in parallel with all elements stored in the N position FIFO, and the 'B' in the odd register is compared with the '2' in the even register along with the first N−1 positions in the N position FIFO. There are two matches for the '2' and one match for the 'B'. In this case, CMatch0 [location of the first '2'] and CMatch0[location of the second '2'] are asserted, and CMatch1 [location of the 'B'] is asserted. The location of the 'B' and the location of the second '2' are the same locations (i.e., the same offset) within the FIFO. In this case, both the SMatch1 and the SMatch0 for the next locations in the FIFO (i.e., for the locations of the {C, 3}) are asserted. In this case, all of MatchA, MatchB and MatchC are asserted indicated a match of four sequential data elements (i.e., {B, 2, C, 3}). Because MatchC is asserted, SMatch0[location of the 'B'] and SMatch1[location of the second '2'] are asserted.

On the next clock the {A, 1} series of data portions are received, and the 'A' is stored as the first portion (labeled "O" in FIG. 3b) and the '1' is stored as the second portion (labeled "E" in FIG. 3b). The '1' in the even register is compared in parallel with all elements stored in the N position FIFO, and the 'A' in the odd register is compared with the '1' in the even register along with the first N–1 positions in the N position FIFO. There are three matches for the '1' and one match for the 'A'. In this case, CMatch0 [location of the first '1'], CMatch0[location of the second '1'] and CMatch0[location of the third '1'] are asserted, and CMatch1[location of the 'A'] is asserted. The location of the 'A' and the location of the third '1' are the same locations (i.e., the same offset) within the FIFO. In this case, both the SMatch1 and the SMatch0 for the next locations in the FIFO (i.e., for the locations of the {B, 2}) are asserted. In this case, all of MatchA, MatchB and MatchC are asserted indicated a match of four sequential data elements (i.e., {A, 1, B, 2}). Because MatchC is asserted, SMatch0[location of the 'A'] and SMatch1[location of the third '1'] are asserted.

On the next clock the {9, 7} series of data portions are received, and the '9' is stored as the first portion (labeled "O" in FIG. 3b) and the '7' is stored as the second portion (labeled "E" in FIG. 3b). The '7' in the even register is compared in parallel with all elements stored in the N position FIFO, and the '9' in the odd register is compared with the '7' in the even register along with the first N–1 positions in the N position FIFO. There is one match for the '7' and one match for the '9'. In this case, CMatch0[location of the '7'] CMatch1 [location of the '9'] are asserted. The location of the '9' and the location of the '7' are not sequential locations within the FIFO. In this case, none of MatchA, MatchB, nor MatchC are asserted. Because of this, the previous matches indicated in SMatch0 and SMatch1 (i.e., {A, 1, B, 2, C, 3, D, 4}) are discontinuous and ready for encoding.

In particular, a matched location 1382 corresponds to the original location 1384 within the data stream. The non-matched locations are augmented to include a non-encoded flag (shown as 'i') and with the regions that are not encoded labeled "encoded literals" or shown as encoded literals 1387 corresponding to original location 1384. In contrast, matched location 1382 is encoded to include an encoded flag plus a length and offset. In this case, the length is eight (i.e., the number of literals within matched location that match those in original location 1384. The offset is the distance (i.e., number of data portions) between matched location 1382 and original location 1384, and is shown as an offset 1383. This combination of the encoded flag plus a length and offset are shown as a "CODE" 1386 in an encoded data stream 1385.

When encoded data stream 1385 is recovered, encoded literals 1387 is decoded by stripping the previously added non-encoded flags to yield the data from original location 1384. This same process is performed on all of the other encoded literals. When code 1386 is received, the length and offset information are used to identify the previously decoded data from original location 1384, and a copy of the data from the previously decoded data from original location 1384 is put in place of code 1386 to yield the data corresponding to matched location 1382.

Figure 5:
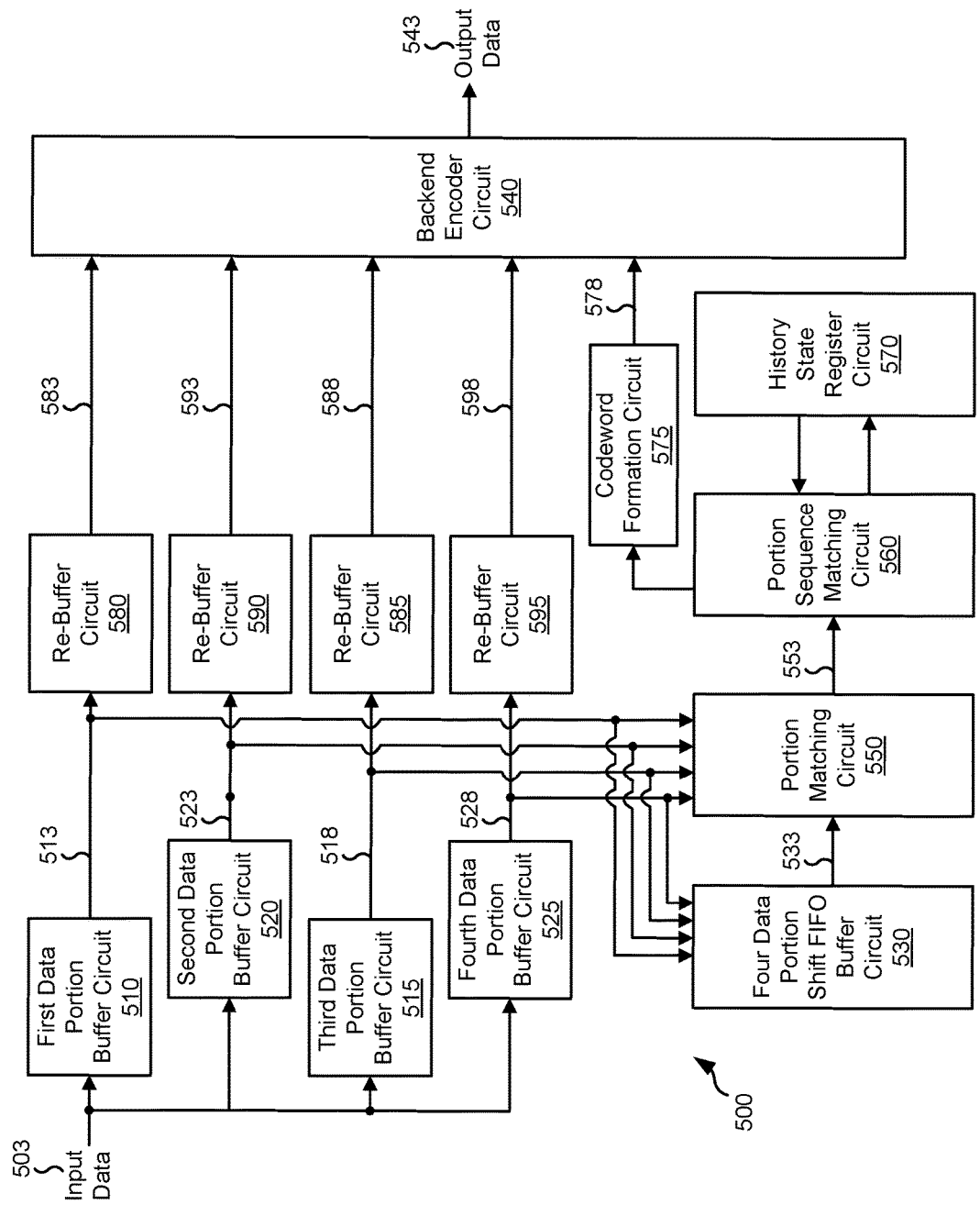
FIG. 5 is a three offset compression based data encoding circuit in accordance with some embodiments of the present inventions.

Turning to FIG. 5, a four input compression based data encoding circuit 500 is shown in accordance with some embodiments of the present inventions. Four input compression based data encoding circuit 500 is similar to two input compression based data encoding circuit 300 discussed above in relation to FIG. 3a, except that: (1) four data portions of input data 503 are processed simultaneously including clocking a data portion of input data 503 into a first data portion buffer circuit 510, a data portion of input data 503 into a second data portion buffer circuit 520, a data portion of input data 503 into a third data portion buffer circuit 515, and a data portion of input data 503 into a third data portion buffer circuit 525; (2) clocking in a first data portion 513, a second data portion 523, a third data portion 518, and a fourth data portion 528 into a four data portion shift FIFO buffer circuit 530 as data within a four data portion shift FIFO buffer circuit 530 are moved four positions on each clock cycle including elimination of the four oldest data portions from four data portion shift FIFO buffer circuit 530, and (3) comparison of an N-portion FIFO output 533 with all four of first data portion 513, second data portion 523, third data portion 518, and fourth data portion 528 on each clock cycle to yield four CMatch arrays provided as a CMatch output 553. Similar to that described above in relation to FIG. 3a, comparison of an N-portion FIFO output 533 with all four of first data portion 513, second data portion 523, third data portion 518, and fourth data portion 528 includes comparing first data portion 513, second data portion 523, third data portion 518, and fourth data portion 528 with each other as well as the data portions in the FIFO. In particular, the second data portion is compared with the first data portion and first N–1 data portions in FIFO output 533; the third data portion is compared with the second data portion, the first data portion and the N–2 data portions in FIFO output 533; and the fourth data portion is compared with the third data portion, the second data portion, the first data portion and the first N–3 data portions in FIFO output 533. Would like to include formula similar to section [0040].

Four re-buffer circuits (i.e., a re-buffer circuit 580, a re-buffer circuit 590, a re-buffer circuit 585, and a re-buffer circuit 595) re-buffer respective ones of first data portion 513, second data portion 523, third data portion 518, and fourth data portion 528 to yield a data portion 583, a data portion 593, a data portion 588, and a data portion 598, respectively. Data portion 583, data portion 593, data portion 588, and data portion 598 are provided to a backend decoder circuit 540.

A portion sequence matching circuit 560 and a history state register circuit 570 operate similar to their analogous circuits in FIG. 3a, except that the logic is modified to identify different match conditions corresponding to the four different CMatch arrays. Where a match is found, a codeword formation circuit 575 generates a code similar to that discussed above in relation to FIG. 3a, and the code is provided as a code output 578 to backend encoder circuit 540. Backend encoder circuit 540 performs the same function as backend insertion circuit 340 of FIG. 3a to yield an encoded output 543.

Figure 6:
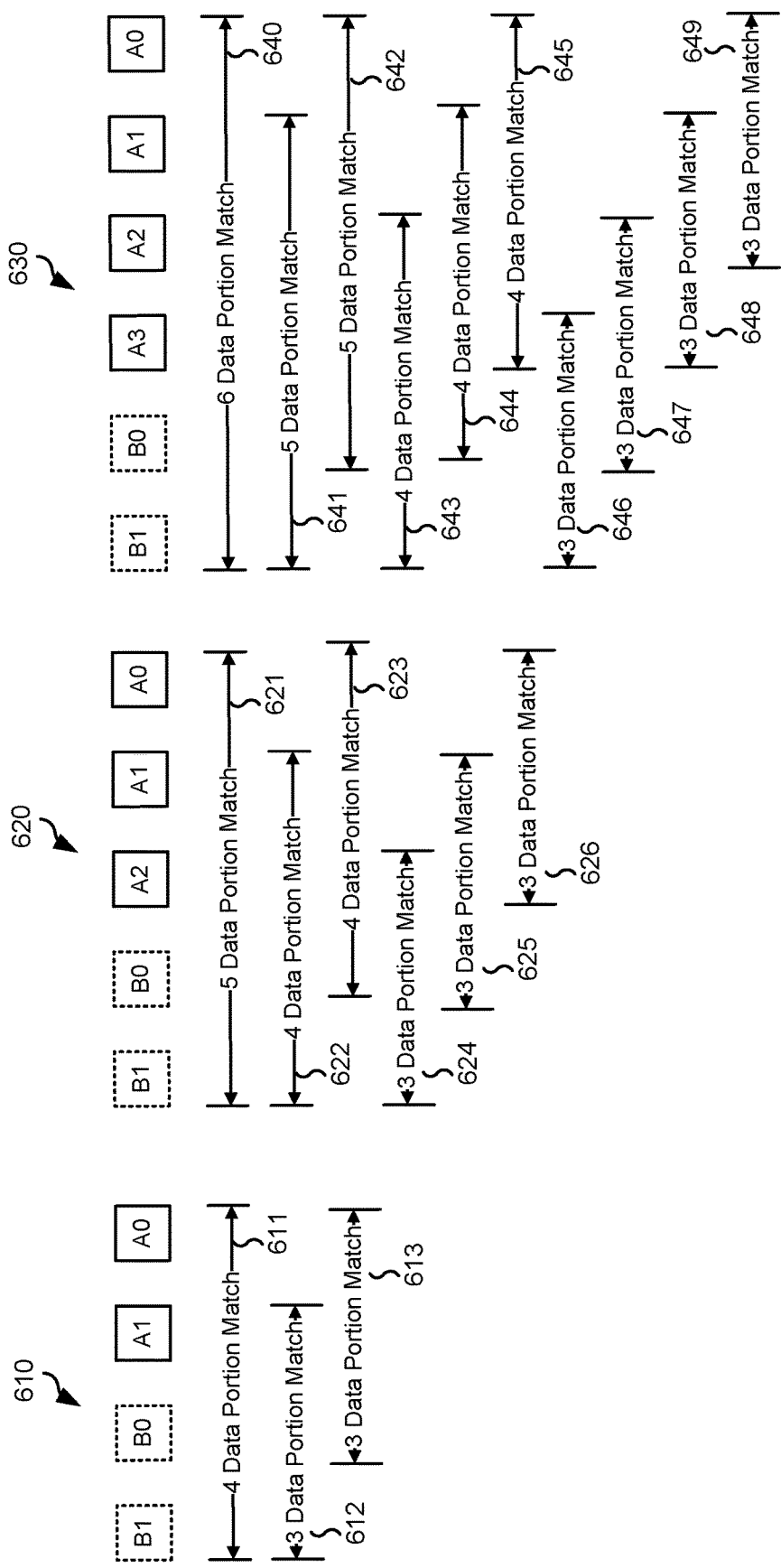
FIG. 6 graphically shows three data portion match scenarios possible in two input compression based encoding circuits, three input compression based encoding circuits, and four input compression based encoding circuits in accordance with different embodiments of the present inventions.

Four the aforementioned four input compression based data encoding circuit 500, there are ten possible sequences of a length of three or greater compared with only the three possibilities discussed above in relation to two input compression based data encoding circuit 300 (i.e., MatchA, MatchB, MatchC). This increase in the number of possibilities allows for a design to select one or more of the ten possible sequences for encoding depending upon variious design considerations. Turning to FIG. 6, three different data portion match scenarios 610, 620, 630 possible in two input compression based encoding circuits, three input compression based encoding circuits, and four input compression based encoding circuits, respectively, are graphically represented in accordance with different embodiments of the present inventions.

The first match scenario 610 corresponds to a two input system having two indices (A0, A1) corresponding to two input data portions, and two indices (B0, B1) corresponding to two most recent FIFO data portions may include three different possible matches of three or more data portions: (1) a 4 data portion match 611 (corresponding to MatchC discussed above in relation to FIG. 3), (2) a 3 data portion match 612 (corresponding to MatchB discussed above in relation to FIG. 3), and (3) a 3 data portion match 612 (corresponding to MatchA discussed above in relation to FIG. 3). As discussed above in relation to FIG. 3, there is a priority of which of MatchA, MatchB or Match C is used in the process of generating a replacement code.

The second match scenario 620 corresponds to a three input system having three indices (A0, A1, A2) corresponding to three input data portions, and two indices (B0, B1) corresponding to two most recent FIFO data portions may include six different possible matches of three or more data portions: (1) a 5 data portion match 621 (corresponding to a match of all of A0, A1, A2, B0, B1), (2) a 4 data portion match 622 (corresponding to a match of A1, A2, B0, B1), (3) a 4 data portion match 623 (corresponding to a match of A0, A1, A2, B0), (4) a 3 data portion match 624 (corresponding to a match of A2, B0, B1), (5) a 3 data portion match 625 (corresponding to a match of A1, A2, B0), and (6) a 3 data portion match 626 (corresponding to a match of A0, A1, A2). As with the two input system, a designer may prioritize which subset of the matches are utilized in selecting sequences for which to generate a replacement code.

The third match scenario 630 corresponds to a four input system (as discussed above in relation to FIG. 5) having three indices (A0, A1, A2, A3) corresponding to four input data portions, and two indices (B0, B1) corresponding to two most recent FIFO data portions may include ten different possible matches of three or more data portions: (1) a 6 data portion match 640 (corresponding to a match of all of A0, A1, A2, A3, B0, B1), (2) a 5 data portion match 641 (corresponding to a match of all of A1, A2, A3, B0, B1), (3) a 5 data portion match 642 (corresponding to a match of A0, A1, A2, A3, B0), (4) a 4 data portion match 643 (corresponding to a match of A2, A3, B0, B1), (5) a 4 data portion match 644 (corresponding to a match of A1, A2, A3, B0), (6) a 4 data portion match 645 (corresponding to a match of A0, A1, A2, A3), (7) a 3 data portion match 646 (corresponding to a match of A3, B0, B1), (8) a 3 data portion match 647 (corresponding to a match of A2, A3, B0), (9) a 3 data portion match 648 (corresponding to a match of A1, A2, A3), and (10) a 3 data portion match 649 (corresponding to a match of A0, A1, A2). As with the two input system, a designer may prioritize which subset of the matches are utilized in selecting sequences for which to generate a replacement code.

It should be noted that while two input, three input and four input systems have been discussed, that systems with five or more inputs are also possible in accordance with different embodiments of the present invention. Additionally, it should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent—albeit such a system would not be a circuit as that term is used herein. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A compression based data encoding system, the system comprising:
   a FIFO having storage locations for N data portions, wherein N is an integer value, and wherein the FIFO is operable to:
      shift each of the N data portions by K positions within the FIFO on each clock cycle;
      receive K input data portions, wherein K is an integer value greater than one; and
      store the received K input data portions into the first K storage locations in the FIFO;
   a portion matching circuit operable to:
      compare a first input data portion with each of the N data portions in the FIFO to yield an input match set[1];
      for each of the K input data portions indicated as K[i] wherein i is an integer value between two and K, compare K[i] with each of K[1] to K[i−1] and the most recent N−(i−1) data portions in the FIFO to yield an input match set[i], wherein comparing the K[i] with each of K[1] to K[i−1] and the most recent N−(i−1) data portions in the FIFO is done in parallel with comparing the first input data portion with each of the N data portions in the FIFO;
   a segment matching circuit operable to:
      receive input match set[1] and input match set[i];
      identify a series of at least M preceding data portions within the N data portions of the FIFO that match a sequence of at least M data portions, wherein M is an integer value; and
      generate a code indicating a number of data portions in the at least M incoming data portions and a distance between the at least M incoming data portions and the at least M preceding data portions.

2. The compression based data encoding system of claim 1, wherein the segment matching circuit is further operable to:
  receive a first historical match set and a second historical match set,
  based at least in part on a subset of the combination of input match set[1] and input match set[i], the first historical match set, and the second historical match set, determine a set of sequence match indicators corresponding to a list of sequences of at least M incoming data portions including a subset of the input data portions and a subset of data portions corresponding to the historical match sets;
  select a subset of the sequence match indicators to yield selected valid sequence match indicators;
  based upon the selected valid sequence match indicators, generated valid data portion sequence matches; and
  update the first historical match set and the second historical match set based at least in part upon the selected valid sequence match indicators to yield a first updated historical match set and a second updated historical match set; and
  wherein the segment matching circuit further comprises:
  a register circuit operable to store the first updated historical match set and the second updated historical match set; and
  a codeword formation circuit operable to generate the code indicating a number of data portions in a selected valid sequence match of at least M incoming data portions and a distance between the at least M incoming data portions and the at least M preceding data portions when the selected valid sequence match ends.

3. A compression based data encoding system, the system comprising:
  a FIFO operable to store a series of N data portions;
  a portion matching circuit operable to:
    compare a first input data portion with each of the N data portions in the FIFO to yield a first match set;
    compare a second input data portion with each of the first input data portion and the most recent N−1 data portions in the FIFO to yield a second match set, wherein comparing the second input data portion with each of the first input data portion and the most recent N−1 data portions in the FIFO is done in parallel with comparing the first input data portion with each of the N data portions in the FIFO;
  a segment matching circuit operable to:
    receive the first match set and the second match set;
    identify a series of at least M preceding data portions within the N data portions of the FIFO that match a sequence of at least M incoming data portions; and
    generate a code indicating a number of data portions in the at least M incoming data portions and a distance between the at least M incoming data portions and the at least M preceding data portions.

4. The compression based data encoding system of claim 3, wherein N is 2048.

5. The compression based data encoding system of claim 3, wherein M is three.

6. The compression based data encoding system of claim 3, wherein the data portions are each eight bits.

7. The compression based data encoding system of claim 3, the system further comprising:
  a backend encoder circuit operable to replace the at least M incoming data portions with the code to yield an encoded output.

8. The compression based data encoding system of claim 3, wherein the segment matching circuit comprises:
  a portion sequence matching circuit operable to:
    receive the first match set, the second match set, a first historical match set, and a second historical match set;
    based at least in part on a subset of a combination of the first match set, the second match set, a first historical match set, and a second historical match set, determine a set of sequence match indicators corresponding to a list of sequences of at least M incoming data portions including a subset of the input data portions and a subset of data portions corresponding to the historical match sets;
    select a subset of the sequence match indicators to yield selected valid sequence match indicators;
    based upon the selected valid sequence match indicators, generated valid data portion sequence matches; and
    update the first historical match set and the second historical match set based at least in part upon the selected valid sequence match indicators to yield a first updated historical match set and a second updated historical match set; and
  wherein the segment matching circuit further comprises:
    a register circuit operable to store the first updated historical match set and the second updated historical match set; and
    a codeword formation circuit operable to generate the code indicating a number of data portions in a selected valid sequence match of at least M incoming data portions and a distance between the at least M incoming data portions and the at least M preceding data portions.

9. The compression based data encoding circuit of claim 1, wherein the segment matching circuit generates the code during a single clock cycle.

10. The compression based encoding circuit of claim 9, wherein at least the first input data portion and the second input data portion are clocked into the FIFO on a single clock cycle.

11. The compression based data encoding circuit of claim 3, wherein matched sequences of a data portions including more than M data portions are encoded.

12. The compression based data encoding circuit of claim 3, wherein the system is implemented as part of an integrated circuit.

13. The compression based data encoding circuit of claim 3, wherein the system is implemented as part of a storage device.

14. The compression based data encoding circuit of claim 3, wherein the least M incoming data portions includes at least one of the first input data portion or the second input data portion.

15. A method for compression based data encoding, the method comprising:
  providing a FIFO of a length N and operable to store N data portions;
  comparing a first input data portion with each of the N data portions in the FIFO to yield a first match set;
  comparing a second input data portion with each of the first input data portion and the most recent N−1 data portions in the FIFO to yield a second match set, wherein comparing the second input data portion with each of the first input data portion and the most recent N−1 data portions in the FIFO is done in parallel with comparing the first input data portion with each of the N data portions in the FIFO;

identifying a series of at least M preceding data portions within the N data portions of the FIFO that match a sequence of at least M incoming data portions; and generating a code indicating a number of data portions in the at least M incoming data portions and a distance between the at least M incoming data portions and the at least M preceding data portions.

16. The method of claim 15, wherein identifying a series of at least M preceding data portions within the N data portions of the FIFO that match a sequence of at least M incoming data portions and generating the code is done during a single clock cycle.

17. The method of claim 16, the method further comprising:

storing both the first input data portion and the second input data portion to the FIFO during a single clock cycle.

18. The method of claim 15, wherein N is 2048.

19. The method of claim 15, wherein M is three.

20. The method of claim 15, wherein the data portions are each eight bits.

* * * * *